METHOD OF MAKING MICROCIRCUIT PATTERN MASKS

Filed Nov. 16, 1965 2 Sheets-Sheet 1

INVENTOR.
FRANK R. CORWIN
BY
Shenier & O'Connor
ATTORNEYS

INVENTOR.
FRANK R. CORWIN
BY
Shenier & O'Connor
ATTORNEYS

United States Patent Office 3,476,658

Patented Nov. 4, 1969

3,476,658
METHOD OF MAKING MICROCIRCUIT PATTERN MASKS

Frank R. Corwin, Milford, Conn., assignor to United Aircraft Corporation, East Hartford, Conn., a corporation of Delaware Filed Nov. 16, 1965, Ser. No. 508,088
Int. Cl. C23b *7/08;* C23f *17/00*
U.S. Cl. 204—11 5 Claims

ABSTRACT OF THE DISCLOSURE

A method of making a microcircuit pattern mask in which a thin film of nickel in the pattern of the mask is electrolytically deposited on a copper substrate through a negative of the mask formed by a photoresist technique. Following formation of the thin film, the substrate is removed therefrom together with the resist by use of a selective etchant. The thin film then is immersed in a suitable bath to provide an electroless deposition of metal on the electrolytically formed film until a mask of the desired thickness has been produced. In this manner there is provided a mask having high resolution and yet which is sufficiently strong and rigid to permit repeated usage of the mask without deformation.

My invention relates to a method of making microcircuit pattern masks and more particularly to a method of making improved masks having high resolution and which are sufficiently rugged to withstand repetitive use.

There are many instances in which it is necessary to deposit extremely accurate fine line patterns of high resolution on a substrate. One example of such an instance is in the formation of passive circuit components such as resistors and capacitor plates on a substrate such, for example, as a slice of silicon or germanium. Where a large number of similar components or circuits are being made it is essential that the pattern be able to be reproduced identically a large number of times. In an effort to achieve these results in the prior art, metal masks having openings in the shape of the pattern which it to be deposited have been used. These masks must be held in close contact with the substrate and yet they must faithfully reproduce the pattern.

Various techniques have been used in the prior art for fabricating metal masks of the type described above. Some examples of the methods employed are arc erosion techniques, selective electrolytic plating, selective etching of metal films, electroforming and electron beam techniques. All of the techniques heretofore used suffer from the disadvantages that the resultant masks either are not sufficiently rigid or rugged to withstand ordinary use or else they do not provide a pattern of sufficiently high resolution.

Specifically, the electroplating and electroforming techniques produce a mask having poor edge line definition if an attempt is made to produce a mask of adequate thickness. This poor edge line definition is the result of the well-known "treeing" effect produced by high current density areas. The arc erosion method requires a pattern which must be produced by conventional mechanical machining methods and consequently is limited to comparatively large line widths and spacings. The electron beam technique necessitates the use of expensive equipment and elaborate setups. It does not readily lend itself to multipattern production of only a few masks and the quality of the resultant mask is questionable.

I have invented a method of making microcircuit pattern masks which overcomes the defects of methods of the prior art. My method expeditiously provides a mask which has a high resolution pattern and yet which is sufficiently rigid to withstand ordinary use. The mask produced by my process permits multiple reproductions of the pattern with a high degree of accuracy. My method permits close control of the thickness of the lines and of the interline spacings of the pattern. My method is relatively simple and inexpensive for the results achieved thereby.

One object of my invention is to provide a method of making microcircuit pattern masks having a high resolution.

Another object of my invention is to provide a method of making high resolution metal masks which are sufficiently rugged to withstand ordinary usage without loss of pattern definition.

A further object of my invention is to provide a method of making microcircuit pattern masks which is relatively simple and inexpensive for the result achieved thereby.

Other and further objects of my invention will appear from the following description.

In general my invention contemplates the provision of a method of making a rugged high resolution metal mask in which I first electrolytically deposit a thin pattern in the shape of the mask on a conductive substrate carrying a pattern negative formed by the photoresist process, for example. Having formed a thin pattern. I completely remove the substrate and the resist by use of a selective etchant, for example, and then electrolessly deposit additional metal on the pattern by a chemical reduction process.

In the accompanying drawings which form part of the instant specification and which are to be read in conjunction therewith and in which like reference numerals are used to indicate like parts in the various views.

Figures 1, 2, 3:
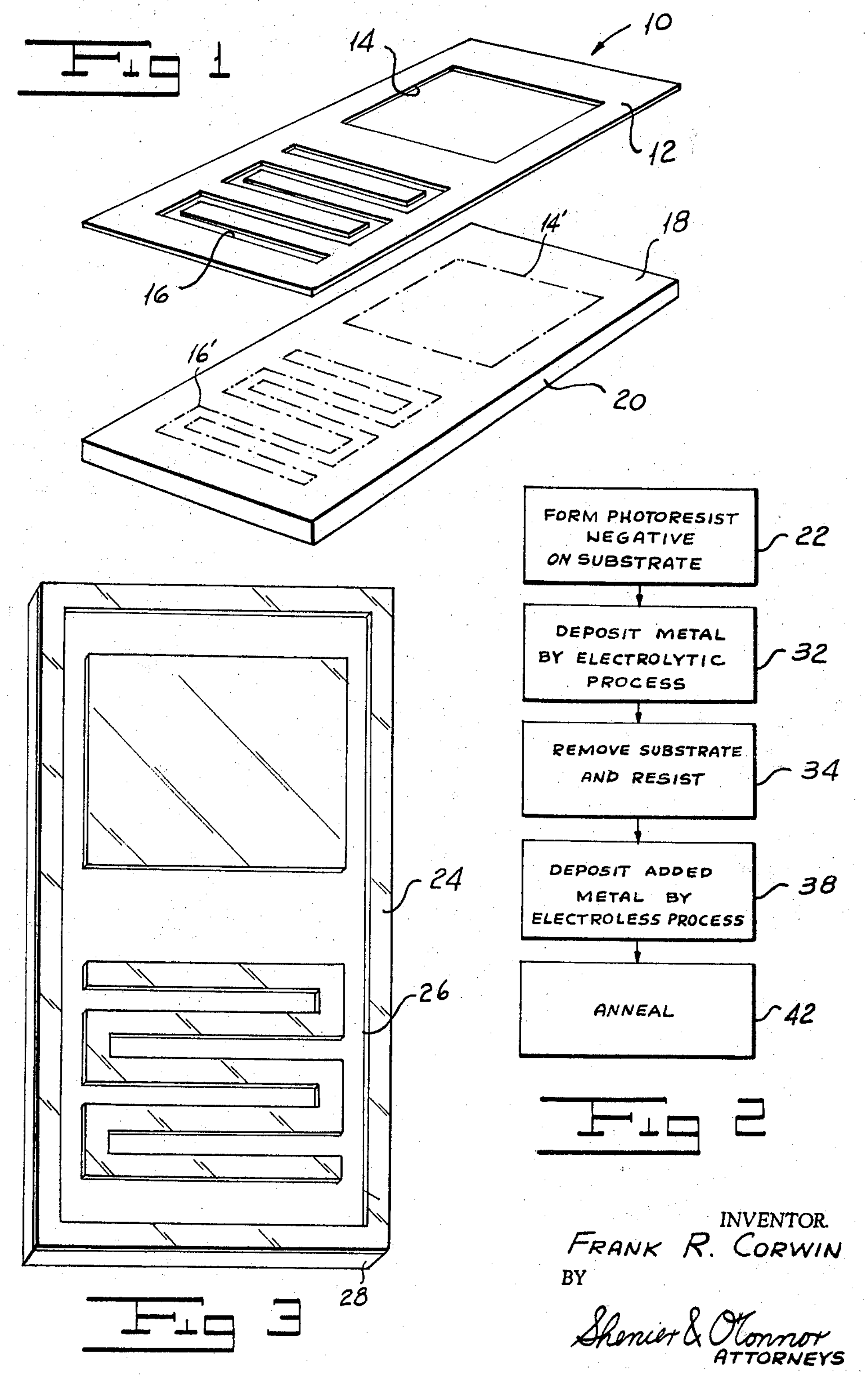
FIGURE 1 is a perspective view of a mask produced by my process and of its relationship to a substrate on which material is to be deposited.
FIGURE 2 is a diagrammatic view illustrating the series of steps making up my method.
FIGURE 3 is a plan view illustrating initial steps of my method of making microcircuit pattern masks.
Figure 4:
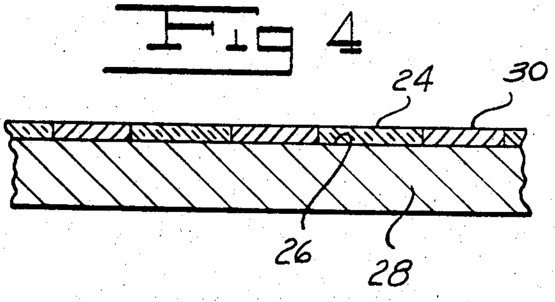
FIGURE 4 is a fragmentary sectional view illustrating an intermediate stage in my method of making microcircuit pattern masks.

Refering to FIGURE 1 of the drawings, a completed mask indicated generally by the reference character 10 includes a metallic body, the character of which will be described more completely hereinafter, having a relatively large opening 14 and a narrow pattern of connected line openings 16. One example of a use for the mask 10 is in connection with the deposition of areas indicated by the dot-dash outlines in FIGURE 1 of material on the upper surface 18 of a substrate 20, which may, for example, be a slice of silicon or germanium. The area 16' of material corresponding to the connected line pattern 16 may form a resistor, for example, in the completed device (not shown) while the area 14' corresponding to the opening 14 may form one plate of a capacitor.

In order to form the deposited patterns with an accurate edge line definition, it is essential that the mask 10 be held in extremely close contact with the surface 18. When that has been achieved, the material may be deposited by any suitable technique known in the art.

As will be apparent from the description hereinafter of my method, the resultant mask 10 is not readily distorted in normal usage. It is of a character similar to that of a sheet of spring steel.

Referring to FIGURE 1 of the drawings, a completed my process indicated by the box 22 in FIGURE 2 is the formation of a layer of resist 24 on the upper surface 26 of a negative pattern of the mask on the substrate surface. This may be achieved in any suitable manner known to the art. Any suitable material may be employed as the substrate 28. For example, copper, zinc, iron or aluminum might be employed. As will be apparent from the following description, different substrates may require different etchants. In one specific example of my method, substrate 28 may be a copper sheet having a thickness of 2 mils.

I form the film 24 as a negative of the mask 10 by techniques known in the art. First, the surface 26 is coated with an appropriate organic insulating photosensitive liquid. This is achieved by spin coating, spraying or painting. When the resist has dried, it is exposed through a mask which is a negative of the desired photoresist pattern. After exposure the resist is developed in an organic solvent such, for example, as trichlorethylene and the unexposed resist washes away. The results of these operations is a remaining resist pattern which is a negative of the desired mask. By way of illustration, in FIGURE 3 the developed resist pattern is represented by the unshaded areas while the exposed surface portions 26 are under the shaded areas.

As will be appreciated by those skilled in the art, by use of the photoresist process an extremely accurate high resolution resist pattern is produced. After having thus produced the resist pattern, I next deposit by an electrolytic process a thin film of metal 30 in the openings of the resist pattern. While I have described the use of the photoresist method for forming film 24 any other suitable method may be employed.

As will be apparent from the description hereinafter of the subsequent steps of my process, the metal deposited in the mask openings must differ from that of which the substrate 28 is composed. There are given below a number of specific examples of my method of forming metal masks:

Example 1

After having formed film 24 on substrate 28 as a negative of the mask pattern in the manner described, I electrolytically deposite nickel from a fluoborate bath onto the exposed surface of the copper substrate 28. In performing this operation I place the substrate carrying the pattern in a bath of from about 225 to about 375 grams per liter of nickel fluoborate and from about 22.5 to about 37.5 grams boric acid in water. In order to ensure uniform thickness of the metallic deposit on the substrate, I space it at a minimum distance of about twelve inches from the anode. I use such an anode-to-substrate potential as will provide a current density of from about 40 amperes to about 100 amperes per square foot. I maintain the bath temperature in the range of from about 37° C. to about 77° C.

Owing to the accurate high resolution resist pattern the deposited metallic pattern likewise is accurate and of high resolution. It is to be understood that the electrolytic deposition is relatively thin and is not carried to the point at which either treeing or resist breakdown might occur. In one instance to form a finished pattern 10 having a thickness of one mil, I first deposit nickel by the electrolytic process described in a thickness of 0.0002 inch. This is achieved by subjecting the substrate to electrolytic action for approximately ten minutes at a current density of 60 amperes per square foot.

Figure 5:
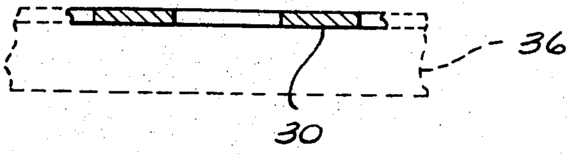
FIGURE 5 is a fragmentary sectional view illustrating a further step in my method of making microcircuit pattern masks.

The block 32 in FIGURE 2 diagrammatically illustrates the electrolytic deposition step of my process. As indicated diagrammatically by the block 34 in FIGURE 2 having thus formed the thin metallic pattern 30 on the substrate 28, I next remove both the substrate 28 and the resist 24 to leave only the thin metallic pattern 30. This may be achieved by use of a selective etchant which dissolves the substrate carrying the resist but which does not affect the metallic pattern 30. One example of a suitable etchant is a solution of 120 gms. of chromic acid and 5 ml. of sulfuric acid in 250 ml. of water. I have discovered that the concentration of the etchant can vary considerably. The only apparent effect is to slow the attack as the solution is made weaker. I have achieved satisfactory results by using from 400 to 600 grams of chromic acid and from 15 to 25 ml. concentrated sulphuric acid in 1000 ml. water. As an alternative to the etchant just described, I may employ ammonium persulfate selectively to etch copper and nickel. Referring to FIGURE 5 I have shown a fragmentary portion of the pattenr 30 after removal of the substrate and resist, the outline of which is indicated by the broken line 36.

Having removed the substrate and the resist to leave the pattern 30 as shown in FIGURE 5, I deposit additional metal on the pattern in a step indicated diagrammatically by the block 38 in FIGURE 2. The additional metal is deposited by an electroless process of chemical reduction. For example, the pattern 30 is immersed in a bath made up of 30 gms. of sodium acetate, which acts as an alkalizer, 30 gms. of nickel chloride, which is the source of nickel, and 20 gms. of sodium hypophosphite, which acts as a reducing agent, in 100 ml. of water. The pH of the bath is maintained between 3.5 and 4.5 with hydrochloric acid. While specific proportions of materials for the electroless bath have been given, satisfactory results should be achieved with ±10% variation in the constituents.

Figure 6:
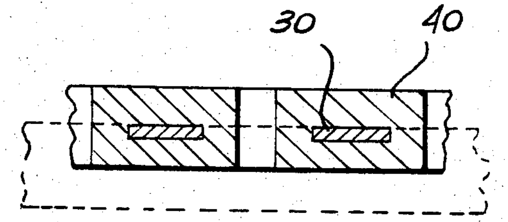
FIGURE 6 is a fragmentary sectional view illustrating a further step in my method of making microcircuit pattern masks.
Figure 7:
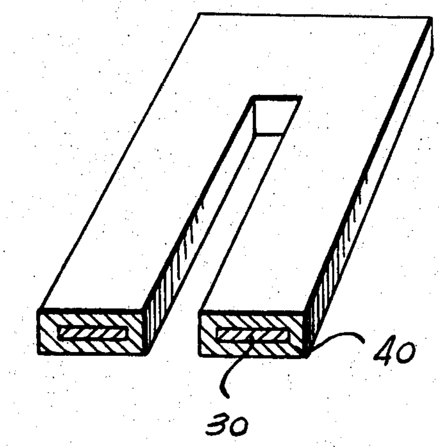
FIGURE 7 is a fragmentary perspective view illustrating a completed mask made by my method of making microcircuit pattern masks.

The temperature of the bath should be carefully controlled to achieve reproducible results. While a deposit can be obtained over the temperature range of about 70° C. to 98° C., I have discovered that the rate at 70° C. is too low while a temperature as high as 98° C. may result in precipitation and nucleation of nickel in the container. Preferably I employ a temperature of 92 ±1° C. The result of this electroless deposition is a uniform buildup of metal 40 around the pattern 30 as indicated in FIGURES 6 and 7. The amount of buildup may be controlled with a high degree of accuracy by controlling the period of time for which the pattern remains in the bath. With the 0.0002 inch thick pattern formed in the electrolytic depositing step described above, in order to produce a finished mask of a thickness of one mil, I immerse the electrolytically formed pattern in the electroless bath for approximately thirty minutes.

When the electroless deposition process has been carried out to the desired degree, the resulting structure is annealed between quartz plates at about 220° C. for a period of about three hours. Preferably, the metal deposited by the electroless process is identical with the electrolytically deposited metal to avoid problems which otherwise might arise owing to the bimetallic temperature effects.

Example 2

Form a mask in the manner described in Example 1 on a zinc or aluminum substrate. Electrolytically deposit copper on the substrate, using an alkaline cyanide bath at a temperature of from 35° to 40° C. and a current density of from about 3 to about 14 emperes per square foot at the cathode. Having formed the thin electrolytic pattern in the mask openings, I then remove the substrate and resist by use of dilute hydrochloric acid. I immerse the remaining thin copper pattern in an electroless aqueous solution of the following constituents:

| | Gms./liter |
|---|---|
| Copper sulphate | 25–30 |
| Sodium carbonate | 20–30 |
| Rochelle salts | 125–130 |
| Tetrasodium-ethylene-diamine-tetraacetic acid | 15–18 |
| Sodium hydroxide | 35–45 |

The pH of the electroless bath is maintained in the range of from about 11.3 to about 11.7 and its temperature at about 95° C. When the desired amount of metal has been deposited by the electroless process, the structure is annealed as in Example 1.

Example 3

I first form a mask in the manner outlined in Example 1 on a substrate of zinc or aluminum. Next I electrolytically deposit chromium in the mask openings using a chromic acid solution with a lead anode, maintaining a bath temperature of 40° to 50° C. and a current density of 100 to 300 amperes per square foot. Having performed the electrolytic deposition, I remove the substrate with sodium hydroxide and immerse the thin pattern in the electroless bath. This bath is an aqueous solution of the following constituents:

| | Gms./liter |
|---|---|
| Chromic bromide | 16.0 |
| Chromic iodide | 1.0 |
| Sodium oxalate | 9.0 |
| Sodium citrate | 10.0 |
| Sodium hypophosphite | 10.0 |

I maintain the bath pH in the range of 8.0 to 10.0 and its temperature in the range 74° to 90° C. The resultant structure is annealed as in Example 1.

Example 4

After forming the mask as in Example 1, I electrolytically deposit palladium on the substrate through the mask openings from a solution of a double chloride of palladium. I employ dilute nitric acid to remove the substrate and mask and place the pattern in an aqueous bath of the following constituents:

| | Gms./liter |
|---|---|
| Tetramine palladium chloride | 5.0–7.0 |
| Disodium-ethylene-diamine-tetraacetic acid | 30.0–35.0 |
| Ammonium hydroxide | 350 |
| Hydrazine | 0.3 |

The bath temperature is maintained at about 80° C. and its pH in the range of about 10.0 to 11.0. After formation of a pattern of the desired thickness the pattern is annealed as in Example 1.

Example 5

Following formation of the mask I electrolytically deposit cobalt on the substrate through the mask openings using a sulphate solution. I maintain the bath at a temperature of 20° to 30° C. and the cathode current density in the range of 30 to 150 amperes per square foot. After removing the substrate and resist as in Example 1 I immerse the thin pattern in an aqueous solution of:

| | Gms./liter |
|---|---|
| Cobalt chloride | 25–35 |
| Sodium citrate | 30–40 |
| Ammonium chloride | 45–55 |
| Sodium hypophosphite | 15–25 |

With a pH of 9.0 to 10.0 and at a temperature in the range of 88° to 94° C. I carry out the electroless deposition until a pattern of the desired thickness is formed. I then anneal the pattern as in Example 1.

In practicing my process of making a metal mask 10 which may, for example, be used to produce patterns such as those indicated by the reference characters 14' and 16' on a substrate 20, I first form a negative film 24 of resist on the surface 26 of a substrate 28 such as copper, zinc, aluminum or iron. Having formed the pattern, I next electrolytically deposit a metal, such as one of the metals identified hereinabove in the examples given, on the surface 26 through the openings of film 24. When that has been done I remove both the substrate 28 and the resist film 24 by a selective etchant which will attack the substrate but not the deposited metal. The result of these steps is a thin metallic pattern as shown in FIGURE 5. When the thin pattern has thus been formed, I place it in an aqueous electroless bath adapted to deposit metal on the thin pattern until a mask of the desired thickness has been built up as shown in FIGURES 6 and 7. The metal deposited by the electroless process preferably should be the same as that deposited by the electrolytic process or at least it should be a metal having very nearly the same temperature coefficient of expansion. As has been pointed out hereinabove, while a very accurate pattern can be formed using electrolytic deposition through a mask such as a photoresist mask, for example, no appreciable thickness can be achieved without destroying the line definition and resolution of the pattern. However, by subsequently using the electroless process to deposit additional metal, a relatively thick mask can be built up without loss of line definition or resolution.

For uniformity of results it is necessary that the process conditions be maintained uniform. This may be accomplished in any suitable manner. A temperature sensitive element may be used to control the bath heater to maintain the bath temperature substantially constant. I may practice my method as a batch process or continuously. Where a batch process is used I change the electroless bath after every second mask has been formed. For continuous operation a pump circulates the bath from a reservoir to the immersing tank and back to the reservoir. At the reservoir the bath is sampled and the constituents added as necessary to maintain the proportions constant.

It will be seen that I have accomplished the objects of my invention. I have provided a metallic mask which is extremely accurate and yet which is rugged enough to withstand repeated usage without damage. My mask has good line definition. By use of my process I can produce a high resolution mask.

It will be understood that certain features and subcombinations are of utility and may be employed without reference to other features and subcombinations. This is contemplated by and is within the scope of my claims. It is further obvious that various changes may be made in details within the scope of my claims without departing from the spirit of my invention. It is, therefore, to be understood that my invention is not to be limited to the specific details shown and described.

Having thus described by invention, what I claim is:

1. A method of making a metallic microcircuit pattern mask including the steps of forming a high resolution resist negative of said mask on a substrate of a first metal, electrolytically depositing another metal through said opening onto said substrate to form a thin high resolution pattern in the shape of said mask, removing said substrate and said resist while leaving said pattern, and then depositing additional metal on said thin pattern by chemical reduction.

2. A method as in claim 1 in which said removing step comprises subjecting said thin pattern and said substrate and resist to the action of a selective etchant to remove said substrate and said resist while leaving said pattern.

3. A method as in claim 1 in which said one metal is copper and said other metal is nickel and in which said removing step comprises subjecting said thin pattern and said substrate and resist to the action of a selective etchant to remove said substrate and said resist while leaving said pattern and in which said depositing step comprises the sub-step of immersing said thin pattern in an electroless bath.

4. A method as in claim 1 in which said additional metal is the same as that of said pattern.

5. A method as in claim 1 including the step of annealing said pattern carrying said additional metal.

References Cited

UNITED STATES PATENTS

| | | | |
|---|---|---|---|
| 2,225,734 | 12/1940 | Beebe | 204—11 |
| 2,640,789 | 6/1953 | Hausner | 204—24 |
| 2,765,230 | 10/1956 | Tinklenberg | 204—11 |

FOREIGN PATENTS 880,678 6/1953 Germany.

JOHN H. MACK, Primary Examiner

T. TUFARIELLO, Assistant Examiner

U.S. Cl. X.R.

117—99; 204—38